United States Patent
Bedell et al.

(10) Patent No.: US 8,039,371 B2
(45) Date of Patent: Oct. 18, 2011

(54) REDUCED DEFECT SEMICONDUCTOR-ON-INSULATOR HETERO-STRUCTURES

(75) Inventors: Stephen W. Bedell, Yorktown Heights, NY (US); Jeehwan Kim, Yorktown Heights, NY (US); Alexander Reznicek, Yorktown Heights, NY (US); Devendra K. Sadana, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 12/496,006

(22) Filed: Jul. 1, 2009

(65) Prior Publication Data

US 2011/0001167 A1 Jan. 6, 2011

(51) Int. Cl.
*H01L 21/20* (2006.01)
*H01L 21/36* (2006.01)

(52) U.S. Cl. ............ 438/481; 438/44; 438/46; 438/478; 438/483; 257/103; 257/347; 257/615; 257/E21.097; 257/E21.126; 257/E21.131

(58) Field of Classification Search ............ 438/44, 438/46, 478, 481, 483; 257/103, 347, 615, 257/E21.097, E21.126
See application file for complete search history.

(56) References Cited

U.S. PATENT DOCUMENTS

| | | | | |
|---|---|---|---|---|
| 5,389,571 A | * | 2/1995 | Takeuchi et al. | 117/89 |
| 6,475,882 B1 | * | 11/2002 | Sakai et al. | 438/483 |
| 6,602,763 B2 | * | 8/2003 | Davis et al. | 438/481 |
| 7,208,393 B2 | * | 4/2007 | Haskell et al. | 438/481 |
| 7,259,049 B2 | | 8/2007 | Chan et al. | |
| 2001/0031385 A1 | * | 10/2001 | Hiramatsu et al. | 428/698 |
| 2005/0051795 A1 | | 3/2005 | Arena et al. | |
| 2006/0194418 A1 | | 8/2006 | Lee et al. | |
| 2006/0267017 A1 | | 11/2006 | Noguchi et al. | |
| 2007/0018285 A1 | | 1/2007 | Xie et al. | |
| 2007/0190678 A1 | * | 8/2007 | Shin | 438/44 |
| 2007/0218622 A1 | | 9/2007 | Lee et al. | |

OTHER PUBLICATIONS

Currie, M.T., et al., "Controlling threading dislocation densities in Ge on Si using graded SiGe layers and chemical-mechanical polishing", Applied Physics Letters, Apr. 6, 1998, pp. 1718-1720, vol. 72, No. 14.
Park, J.-S., et al., "Comparison of selective Ge growth in SiO2 trenches on Si(001) and on blanket Si(001) substrates: Surface roughness and doping", J. Vac. Sci. Technol. B 26(5), Sep./Oct. 2008, pp. 1740-1744.

* cited by examiner

*Primary Examiner* — Dao Nguyen
(74) *Attorney, Agent, or Firm* — Scully, Scott, Murphy & Presser, P.C.; Louis J. Percello, Esq.

(57) ABSTRACT

A semiconductor-on-insulator hetero-structure and a method for fabricating the semiconductor -on-insulator hetero-structure include a crystalline substrate and a dielectric layer located thereupon having an aperture that exposes the crystalline substrate. The semiconductor-on -insulator hetero-structure and the method for fabricating the semiconductor-on-insulator hetero-structure also include a semiconductor layer of composition different than the crystalline substrate located within the aperture and upon the dielectric layer. A portion of the semiconductor layer located aligned over the aperture includes a defect. A portion of the semiconductor layer located aligned over the dielectric layer does not include a defect. Upon removing the portion of the semiconductor layer located aligned over the aperture a reduced defect semiconductor-on-insulator hetero-structure is formed.

9 Claims, 6 Drawing Sheets

REDUCED DEFECT SEMICONDUCTOR-ON-INSULATOR HETERO-STRUCTURES

BACKGROUND

The invention relates generally to semiconductor-on-insulator hetero-structures. More particularly, the invention relates to reduced defect semiconductor layers within the context of semiconductor-on-insulator hetero-structures.

Semiconductor structures typically comprise semiconductor substrates within and upon which are formed semiconductor devices, such as but not limited to resistors, transistors, capacitors and diodes. The semiconductor devices are connected and interconnected using patterned conductor layers that are separated by dielectric layers.

As semiconductor technology has advanced, semiconductor substrate materials have also evolved from generally conventional predominantly silicon containing semiconductor materials (i.e., greater than 50 atomic percent silicon) to include alternative semiconductor materials, such as predominantly germanium containing semiconductor materials (i.e., greater than 50 atomic percent germanium), as well as compound semiconductor materials. For example, predominantly germanium containing semiconductor materials and compound semiconductor materials are desirable insofar as predominantly germanium containing semiconductor materials and compound semiconductor materials often provide a higher carrier mobility in comparison with predominantly silicon containing semiconductor materials.

As an adjunct to the evolution of predominantly germanium containing semiconductor materials and compound semiconductor materials within semiconductor fabrication, there has also evolved semiconductor-on-insulator substrates in comparison with bulk semiconductor substrates. Semiconductor-on-insulator substrates are desirable within the semiconductor fabrication art in comparison with bulk semiconductor substrates insofar as semiconductor-on-insulator substrates provide superior semiconductor device isolation. In conjunction with different semiconductor materials for a base semiconductor substrate and a surface semiconductor layer within a semiconductor-on-insulator substrate a further evolution within semiconductor fabrication involves the fabrication of semiconductor-on-insulator hetero-structures.

Although predominantly germanium containing semiconductor materials and compound semiconductor materials are thus desirable within the context of semiconductor-on-insulator hetero-structures within the semiconductor fabrication art, predominantly germanium containing semiconductor materials and compound semiconductor materials within the context of semiconductor-on-insulator hetero-structures are nonetheless not entirely without problems. In that regard, predominantly germanium containing semiconductor materials and compound semiconductor materials within the context of semiconductor-on-insulator hetero-structures are often difficult to fabricate absent crystalline defects, such as but not limited to stacking (i.e., misfit) dislocation defects and threading dislocation defects.

Thus, desirable within semiconductor fabrication are methods and materials that provide for reduced defect (i.e., less than 10e6 defects per square centimeter and more preferably less than 10e5 defects per square centimeter, and still more preferably less than less than 10e4 defects per square centimeter) predominantly germanium containing layers and compound semiconductor layers within semiconductor-on-insulator hetero-structures.

BRIEF SUMMARY

The invention includes a semiconductor-on-insulator hetero-structure, as well as a method for fabricating the semiconductor-on-insulator hetero-structure. In a general embodiment, the semiconductor-on-insulator hetero-structure includes a crystalline substrate having located and formed thereupon a dielectric layer (that may include, but is not necessarily limited to a plurality of dielectric layers) that includes an aperture that exposes the crystalline substrate. A semiconductor layer of composition different than the crystalline substrate is located and formed within and over the aperture. A portion of the semiconductor layer located aligned within and over the aperture includes a comparatively high defect density. A portion of the semiconductor layer located aligned (preferably planar) over the dielectric layer includes a comparatively low defect density. The invention also contemplates additional more specific embodiments that derive from the general embodiment. Comparatively high defect densities and comparatively low defect densities are defined in greater detail below.

The method for fabricating the semiconductor-on-insulator hetero-structure in accordance with the invention includes a masked vertical epitaxial method that provides the portion of the semiconductor layer aligned within and over the aperture that includes the comparatively high defect density, as well as a masked selective lateral (i.e., horizontal) epitaxial method that provides the portion of the semiconductor layer located aligned over the dielectric layer that includes the comparatively low defect density.

Within the context of the embodiment and the invention, the portion of the semiconductor layer aligned within and over the aperture that includes the comparatively high defect density has a defect density greater than 10e7 defects per square centimeter, and more typically greater than 10e8 defects per square centimeter and still more typically from 10e7 to 10e9 defects per square centimeter. In accordance with further description below, such defects typically may include, but are not necessarily limited to, threading dislocation defects and stacking dislocation defects, but in particular not sidewall defects. Within the context of the embodiment and the invention, the portion of the semiconductor layer aligned over the dielectric layer that has the comparatively low defect density has a defect density less than 10e6, more preferably less than 10e5 and still more preferably less than 10e4 defects per square centimeter. These particular defects may also include, but are not necessarily limited to threading dislocation defects and stacking dislocation defects, and are also intended as including surface defects.

A particular semiconductor structure in accordance with the invention includes a crystalline substrate. This particular semiconductor structure also includes a dielectric layer located upon the crystalline substrate and having an aperture that leaves exposed a portion of the crystalline substrate. This particular semiconductor structure also includes a semiconductor layer of composition different than the crystalline substrate located within and over the aperture and upon the dielectric layer. A portion of the semiconductor layer located aligned within and also aligned over the aperture includes a comparatively high defect density. A portion of the semiconductor layer located aligned over the dielectric layer includes a comparatively low defect density.

Another particular semiconductor structure in accordance with the invention includes a crystalline substrate. This other particular semiconductor structure includes a dielectric layer located upon the crystalline substrate and having an aperture that leaves exposed a portion of the crystalline substrate. This other particular semiconductor structure includes a crystalline material layer of composition different than the crystalline substrate located within, extending over and aligned over the aperture and including a comparatively high defect density within the crystalline material layer. This other particular semiconductor structure includes a strained semiconductor layer of composition different than the crystalline material layer abutting the crystalline material layer and aligned over the dielectric layer and including a comparatively low defect density within the strained semiconductor layer.

A particular method for fabricating a semiconductor structure in accordance with the invention includes forming upon a crystalline substrate a dielectric layer that includes an aperture that leaves exposed a portion of the crystalline substrate. This particular method also includes forming a semiconductor layer of composition different than the crystalline substrate within and over the aperture, and upon the dielectric layer. A portion of the semiconductor layer formed aligned within and aligned over the aperture includes a comparatively high defect density. A portion of the semiconductor layer formed aligned over the dielectric layer includes a comparatively low defect density.

Another particular method for fabricating a semiconductor structure in accordance with the invention includes forming upon a crystalline substrate a dielectric layer having an aperture that leaves exposed a portion of the crystalline substrate. This other particular method includes forming a crystalline material layer of composition different than the crystalline substrate within, extending over and aligned over the aperture and including a comparatively high defect density within the crystalline material layer. This other particular method includes forming a strained semiconductor layer of composition different than the crystalline material layer abutting the crystalline material layer and aligned over the dielectric layer and including a comparatively low defect density within the semiconductor layer.

BRIEF DESCRIPTION OF THE SEVERAL VIEWS OF THE DRAWINGS

The invention, which includes a semiconductor-on-insulator hetero-structure and a method for fabricating the semiconductor-on-insulator hetero-structure, is understood within the context of the Detailed Description, as set forth below. The Detailed Description is understood within the context of the accompanying drawings, that form a material part of this disclosure, wherein.

DETAILED DESCRIPTION

The invention, which includes a semiconductor-on-insulator hetero-structure and a method for fabricating the semiconductor-on-insulator hetero-structure, is understood within the context of the description set forth below. The description set forth below is understood within the context of the drawings described above. Since the drawings are intended for illustrative purposes, the drawings are not necessarily drawn to scale.

Figure 1:
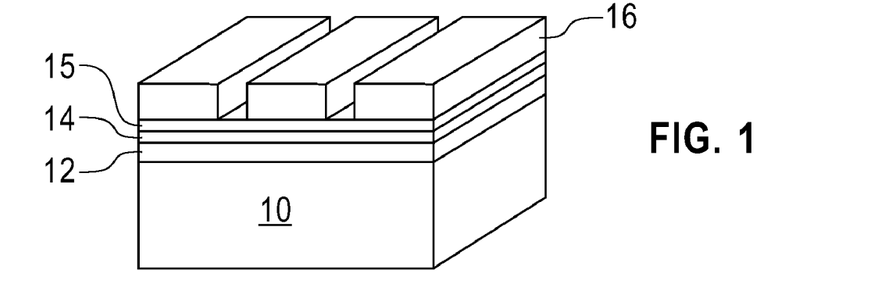
FIG. 1 to FIG. 8 show a series of schematic perspective-view diagrams illustrating the results of progressive dielectric layer fabrication and masking (FIG. 1), dielectric layer patterning (FIG. 2), vertical hetero-epitaxial growth (FIG. 3), selective capping layer growth (FIG. 4), partial dielectric layer stripping (FIG. 5), selective capping layer oxidation (FIG. 6), and selective lateral epitaxial growth (FIG. 7 and FIG. 8) process steps in fabricating a semiconductor-on-insulator hetero-structure in accordance with a general embodiment of the invention that serves as a basis for a plurality of more particular specific embodiments of the invention.

FIG. 1 to FIG. 8 show a series of schematic perspective-view diagrams illustrating the results of progressive stages in fabricating a semiconductor-on-insulator hetero-structure in accordance with a particular embodiment of the invention. This particular embodiment of the invention comprises a first general embodiment of the invention from which a plurality of more specific embodiments of the invention is derived in accordance with further disclosure below. FIG. 1 shows a schematic perspective-view diagram of the semiconductor-on-insulator hetero-structure at an early stage in the fabrication thereof in accordance with this particular first general embodiment.

FIG. 1 shows a crystalline substrate 10. A first dielectric layer 12 is located and formed upon the crystalline substrate 10. A second dielectric layer 14 is located and formed upon the first dielectric layer 12. A third dielectric layer 15 is located and formed upon the second dielectric layer 14 and a mask 16 is located and formed upon the third dielectric layer 15. Within this particular first general embodiment the crystalline substrate 10, the first dielectric layer 12, the second dielectric layer 14, the third dielectric layer 15 and the mask 16 may comprise materials and have dimensions that are otherwise generally conventional in the semiconductor fabrication art.

The crystalline substrate 10 may comprise any of several appropriate crystalline materials. Included in particular are crystalline silicon containing semiconductor materials (which may provide an epitaxial base for forming more germanium rich semiconductor materials), as well as crystalline sapphire materials (which may provide an epitaxial base for forming gallium nitride semiconductor materials). Typically, the crystalline substrate 10 comprises a silicon semiconductor material (i.e., a bulk silicon semiconductor substrate) that has a thickness from 0.3 to 1 millimeters.

The first dielectric layer 12, the second dielectric layer 14 and the third dielectric layer 15 comprise different dielectric materials that have different etch selectivity properties in a particular etchant that is used within the context of further processing of the semiconductor-on-insulator hetero-structure whose schematic perspective-view diagram is illustrated in FIG. 1. In general, the first dielectric layer 12, the second dielectric layer 14 and the third dielectric layer 15 may each comprise a separate dielectric material selected from the group including but not limited to silicon oxide dielectric materials, silicon nitride dielectric materials and silicon oxynitride dielectric materials. Oxides, nitrides and oxynitrides of other elements are not excluded as dielectric materials for the first dielectric layer 12, the second dielectric layer 14 and the third dielectric layer 15. The first dielectric layer 12, the second dielectric layer 14 and the third dielectric layer 15 may be formed using methods and materials that are appropriate for the dielectric materials from which may be comprised the first dielectric layer 12, the second dielectric layer 14 and the third dielectric layer 15. Such methods may in particular include, but are not necessarily limited to, chemical vapor deposition methods and physical vapor deposition methods. Typically, the first dielectric layer 12 and the third dielectric layer 15 comprises a silicon oxide dielectric material that has a thickness from 1 to 1000 nanometers for the first dielectric layer 12 and 1 to 50 nanometers for the third dielectric layer 15. Typically, the second dielectric layer 14 comprises a silicon nitride dielectric material that has a thickness from 5 to 100 nanometers. Alternative materials selections and thickness dimensions are not precluded for the first dielectric layer 12, the second dielectric layer 14 and the third dielectric layer 15.

The mask 16 comprises a mask material. Suitable mask materials may include, but are not necessarily limited to, hard mask materials and resist mask materials, such as but not limited to photoresist mask materials. Photoresist mask materials are considerably more common. Photoresist mask materials may include, but are not necessarily limited to positive photoresist materials, negative photoresist materials and hybrid photoresist materials that include characteristics and properties of positive photoresist materials and negative photoresist materials. Photoresist mask materials are typically formed into the mask 16 while using a spin-coating method, followed by appropriate photoexposure and development. Typically, the mask 16 comprises a positive photoresist material or a negative photoresist material that has a thickness from 0.1 to 3 micrometers.

Figure 2:
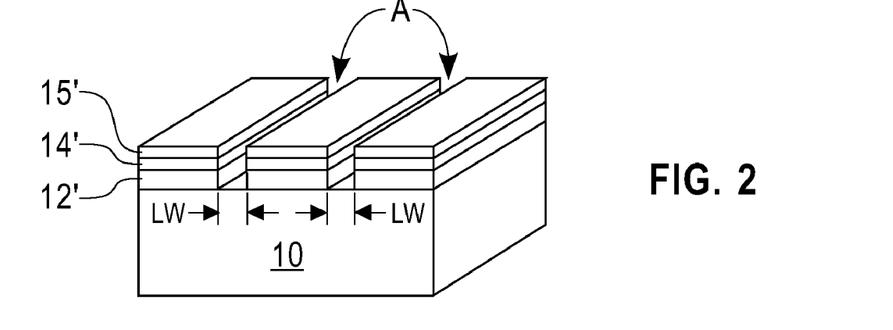

FIG. 2 shows the results of patterning the third dielectric layer 15, the second dielectric layer 14 and the first dielectric layer 12 to form a third dielectric layer 15', a second dielectric layer 14' and a first dielectric layer 12' that define a plurality of apertures A while using the mask 16 as an etch mask. As is illustrated within the schematic perspective-view diagram of FIG. 2, each of the plurality of apertures A has a linewidth LW from 10 to 1000 nanometers and leaves exposed at the base of the apertures A the crystalline substrate 10. The linewidth LW must be greater tan an equilibrium dislocation spacing for a laterally-grown semiconductor layer on a semiconductor substrate to ensure the relaxation of the laterally-grown semiconductor layer. Although not specifically illustrated within the schematic perspective-view diagram of FIG. 2, the apertures A are often intended as a single aperture in a grid shape, although such a geometry does not limit the embodiment or the invention. Under such circumstances, the first dielectric layer 12', the second dielectric layer 14' and the third dielectric layer 15' will typically comprise a plurality of separated first dielectric layers, a plurality of separated second dielectric layers and a plurality of separated third dielectric layers, although the remainder of this disclosure will describe the first dielectric layer 12', the second dielectric layer 14' and the third dielectric layer 15' in the singular. The third dielectric layer 15, the second dielectric layer 14 and the first dielectric layer 12 may be etched and patterned to form the third dielectric layer 15', the second dielectric layer 14' and the first dielectric layer 12' while using the mask 16 as an etch mask while using etch methods and etch materials that are otherwise generally conventional in the semiconductor fabrication art. Such etch methods and etch materials may include, but are not necessarily limited to, wet chemical etch methods and materials and dry plasma etch methods and materials. Dry plasma etch methods and materials are generally preferred insofar as dry plasma etch methods and materials typically provide generally straight sidewalls of patterned layers in comparison with wet chemical etch methods and materials.

Figure 3:
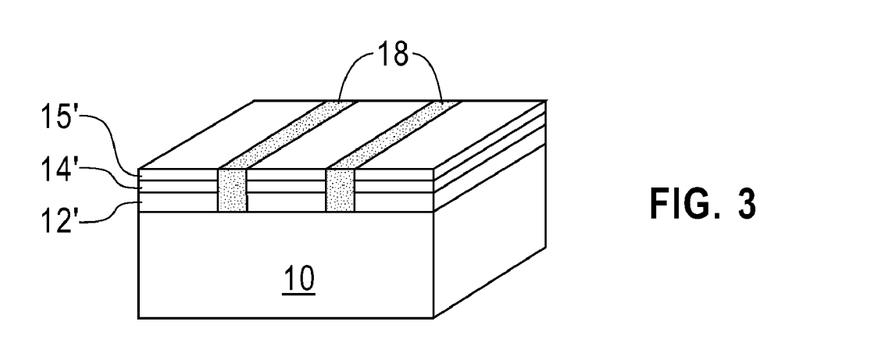

FIG. 3 shows the results of vertically epitaxially growing and depositing a plurality of semiconductor material layers 18 (that again may be intended, but not necessarily limited, as a single grid shaped semiconductor material layer) within the plurality of apertures A that separate the first dielectric layers 12', the second dielectric layers 14' and the third dielectric layer 15' that are illustrated in FIG. 2, and that also expose the crystalline substrate 10. Within this particular embodiment, the semiconductor material layers 18 comprise a different material than the crystalline substrate 10. Insofar as the semiconductor material layers 18 are grown epitaxially, the semiconductor material layers 18 replicate the crystalline orientation of the crystalline substrate 10. However, since the semiconductor material layers 18 and the crystalline substrate 10 comprise different materials that have different lattice spacings, the semiconductor material layers 18 (which are intended to be formed fully relaxed) include defects such as but not limited to threading dislocation defects and stacking dislocation defects (as quantified above within the Summary) aligned over the crystalline substrate 10 within the apertures A defined by the first dielectric layers 12', the second dielectric layers 14' and the third dielectric layers 15'. The defects, such as dislocations formed at the interface between a vertically-grown semiconductor layer and the substrate due to lattice mismatch, leaves threading arms and forms stacking faults throughout dislocation propagation process. For a given semiconductor substrate orientation such as <100>, two forms of dislocations exist, which include 90 degree dislocations and 60 degree dislocations. 90 degree dislocations move vertically at a right angle with respect to a substrate so that a by-product defect of a 90 degree dislocation propagation does not reach a side-wall, but rather extends to a top surface of an epitaxially grown semiconductor material layer. In comparison, propagation of a 60 degree dislocation leads to the defect formation at a sidewall of an epitaxially grown semiconductor material layer since such a defect propagates 63.5 degree vicinal to the surface of the epitaxially grown semiconductor material layer. Thus, when a subsequent semiconductor layer is laterally epitaxially grown from the side wall of the epitaxially grown semiconductor material layer, defects formed by a 60 degree dislocation propagation terminate at the edge of a laterally epitaxially grown semiconductor material layer and not a remaining body of laterally epitaxially grown semiconductor material layer.

Figure 4:
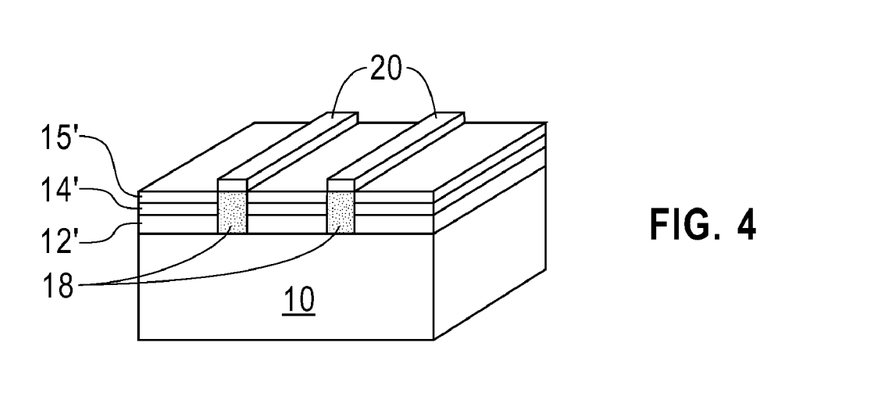

FIG. 4 shows a plurality of capping layers 20 located and formed upon the semiconductor material layers 18. The capping layers 20 may comprise any of several capping materials, including but not limited to conductor capping materials, semiconductor capping materials and dielectric capping materials. Within the context of the schematic diagram of FIG. 4, the capping layers 20 preferably, but not necessarily, comprise a silicon capping material. The silicon capping material may be deposited using the same epitaxial deposition method that is used for deposition the semiconductor material layers 18. Typically, the capping layers 20 are formed to a thickness from 1 to 10 nanometers.

Figure 5:
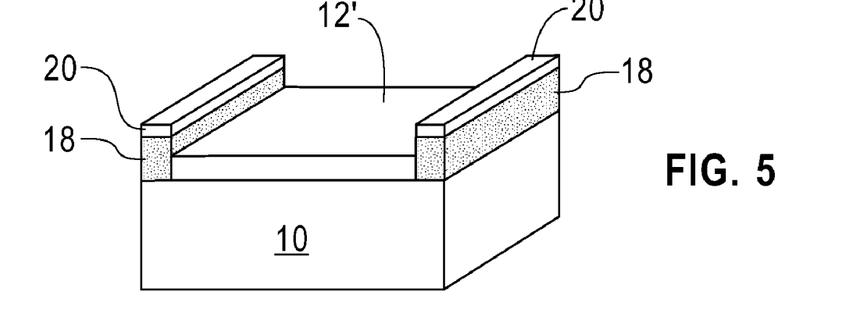

FIG. 5, in a magnified perspective-view diagram, illustrates the results of stripping the third dielectric layer 15' and the second dielectric layer 14' from the first dielectric layer 12' within the semiconductor structure of FIG. 4. Such stripping results in apertures of lesser height, and thus portions of the semiconductor material layers 18 are located aligned within, as well as located aligned above, the apertures A. The third dielectric layer 15' and the second dielectric layer 14' may be stripped from the first dielectric layer 12' within the semiconductor structure of FIG. 4 to provide at least in-part the semiconductor structure of FIG. 5 while using stripping methods and stripping materials that are otherwise generally conventional in the semiconductor fabrication art. Included in particular, but also not limiting, are wet chemical stripping methods and materials and dry plasma stripping methods and materials. As a non-limiting example, when the first dielectric layer 12' comprises a silicon oxide dielectric material, the second dielectric layer 14' comprises a silicon nitride dielectric material and the third dielectric layer 15' comprises a silicon oxide dielectric material, the third dielectric layer 15' may be stripped selectively with respect to the second dielectric layer 14' while using an aqueous hydrofluoric acid containing solution at elevated temperature and the second dielectric layer 14' may be stripped selectively with respect to the first dielectric layer 12' (and typically also other surrounding layers) while using an aqueous phosphoric acid etchant at an elevated temperature.

Figure 6:
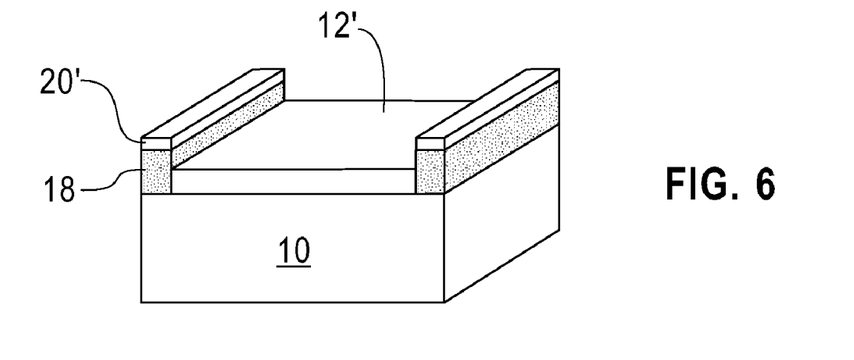

FIG. 6 shows the results of transforming the capping layers 20 into selective masks 20' upon top surfaces, but not sidewall surfaces, of the semiconductor material layers 18. The selective masks 20' may be selectively formed upon the top surfaces of the semiconductor material layers 18 but not the sidewall surfaces of the semiconductor material layers 18 while using methods and materials that are otherwise generally conventional in the semiconductor fabrication art. When the capping layers 20 comprise a silicon material, the capping layers 20 may be transformed into the selective masks 20' that comprise a silicon oxide material by simple thermal, chemical or plasma oxidation methods.

Figures 7, 8:
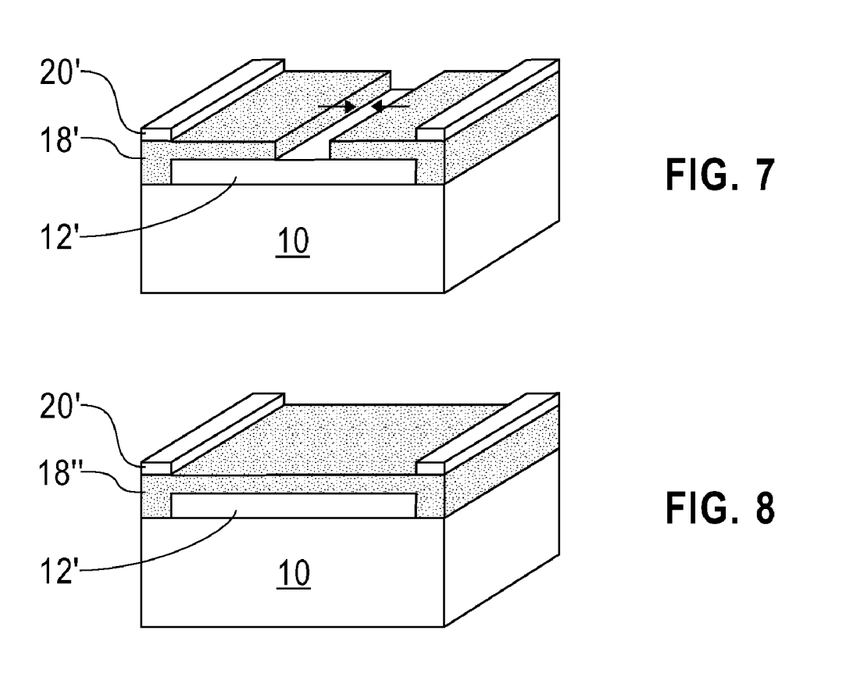

FIG. 7 and FIG. 8 show the results of selectively laterally epitaxially growing the semiconductor material layer 18 that is illustrated in FIG. 6 to provide a semiconductor material layer 18' that is illustrated in FIG. 7 and finally a semiconductor material layer 18" that is illustrated in FIG. 8.

The lateral epitaxial growth of the semiconductor material layer 18 that is illustrated in FIG. 6 to ultimately provide the semiconductor material layer 18" that is illustrated in FIG. 8 is effected by virtue of the presence of the selective masks 20' that inhibit vertical growth of the semiconductor material layer 18" that is illustrated in FIG. 8. Therefore, a thickness of the semiconductor material layer 18 may be controlled with some precision by controlling a thickness of an exposed sidewall of the semiconductor material layer 18.

As is illustrated within the schematic perspective-view diagram of FIG. 8, the semiconductor material layer 18" has a first portion that is located and formed aligned both within and over the reduced height aperture that includes a comparatively high defect density comprising defects other than sidewall defects (i.e., such as but not limited to threading dislocation defects and stacking dislocation defects), and a second portion that is located and formed aligned conformally and planar over and upon the first dielectric layer 12' that by virtue of absence of sidewall defects in the first portion includes a comparatively low defect density (as quantified within the context of the Summary, as above).

FIG. 8 shows a schematic perspective-view diagram of a semiconductor-on-insulator hetero-structure in accordance with a particular general embodiment of the invention that comprises the first general embodiment of the invention and from which will be derived a plurality of more specific embodiments of the invention as described below. The semiconductor-on-insulator hetero-structure includes a crystalline substrate 10 and a first dielectric layer 12' located and formed upon the crystalline substrate 10. The first dielectric layer 12' includes a plurality of reduced height apertures that derive from apertures A (i.e., that may comprise a single aperture) that expose the crystalline substrate 10. Also included within the semiconductor-on-insulator hetero-structure whose schematic perspective-view diagram is illustrated in FIG. 8 is a semiconductor material layer 18" having: (1) a first portion aligned within and aligned over the apertures and including a comparatively high defect density; and (2) a second portion aligned over the first dielectric layer 12' and including a comparatively low defect density.

FIG. 9 to FIG. 12 show a series of schematic cross-sectional diagrams illustrating the results of progressive stages of further fabrication of the semiconductor-on-insulator hetero-structure whose schematic perspective-view diagram is illustrated in FIG. 8 to provide a particular more specific embodiment of the invention.

Figure 9:
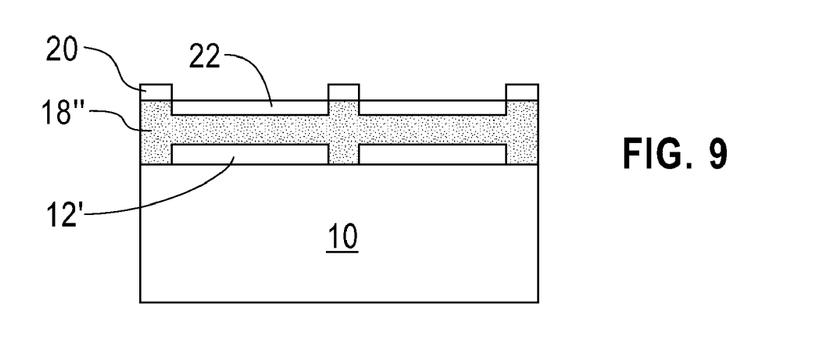
FIG. 9 to FIG. 12 show a series of schematic cross-sectional diagrams illustrating the results of progressive second semiconductor layer deposition (FIG. 9), selective mask stripping (FIG. 10), semiconductor layer patterning (FIG. 11) and isolation region formation (FIG. 12) process steps in fabricating a semiconductor-on-insulator hetero-structure in accordance with a particular more specific embodiment of the invention.

FIG. 9 first shows a slight recess (i.e., from 1 to 20 nanometers) of the semiconductor material layer 18" beneath the selective masks 20'. The semiconductor material layer 18" may be slightly recessed beneath the selective masks 20' while using selective etch methods that are otherwise generally conventional in the semiconductor fabrication art. Included in particular, but also not limiting, are wet chemical etch methods and dry plasma etch methods that use specific selective etchants that are appropriate to the material from which is comprised the semiconductor material layer 18".

FIG. 9 also shows a second semiconductor material layer 22 located and formed upon the semiconductor material layer 18". The second semiconductor material layer 22 will typically comprise a different semiconductor material in comparison with the semiconductor material layer 18". For example, when the semiconductor material layer 18" comprises a germanium semiconductor material, the second semiconductor material layer 22 may comprise a silicon semiconductor material as a conventional semiconductor material, or alternatively a compound semiconductor material such as but not limited to a gallium arsenide semiconductor material. Typically such a silicon semiconductor material and a compound semiconductor material are formed to a thickness from 1 to 10 nanometers.

Figure 10:
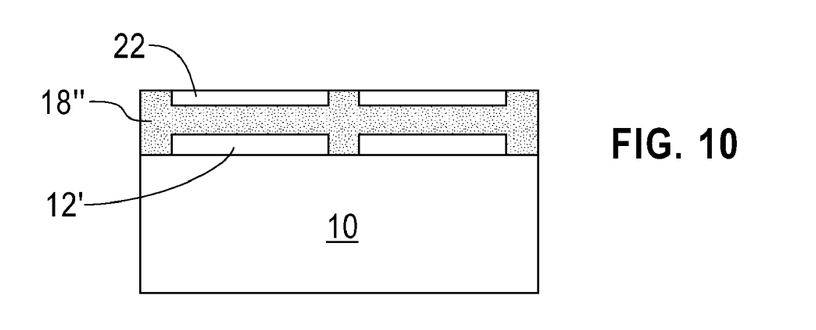

FIG. 10 shows the results of stripping the selective masks 20' from the semiconductor-on-insulator hetero-structure of FIG. 9. The selective masks 20' may be stripped from the semiconductor-on-insulator hetero-structure of FIG. 9 to provide the semiconductor-on-insulator hetero-structure of FIG. 10 while using stripping methods and materials that are otherwise generally conventional in the semiconductor fabrication art. Included in particular, but not necessarily limiting, are wet chemical stripping methods and materials and dry plasma stripping methods and materials.

Figure 11:
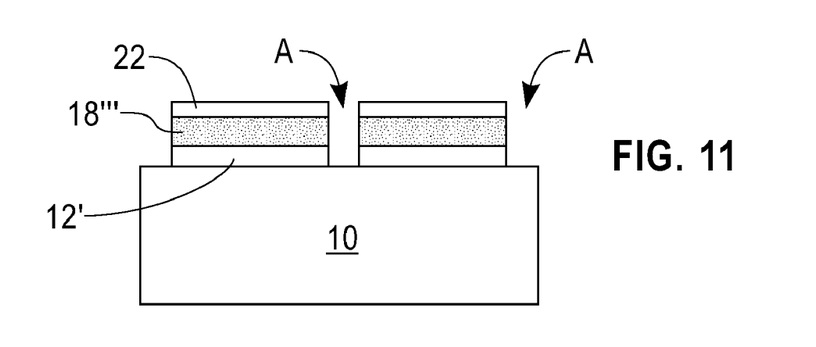

FIG. 11 shows the results of etching the semiconductor material layer 18" while using the second semiconductor material layers 22 as a mask, to provide a plurality of semiconductor material layers 18''' that are aligned with the first dielectric layers 12' and the second semiconductor material layers 22, thus in turn again providing the plurality of apertures A that expose the crystalline substrate 10. The foregoing etching is typically effected using the second semiconductor material layers 22 as an etch mask and while using etch methods including but not limited to wet chemical etch methods and dry plasma etch methods. In accordance with disclosure above, dry plasma etch methods are generally preferred insofar as dry plasma etch methods typically provide for straighter sidewalls for any type of patterned layer, in comparison with wet chemical etch methods.

Figure 12:
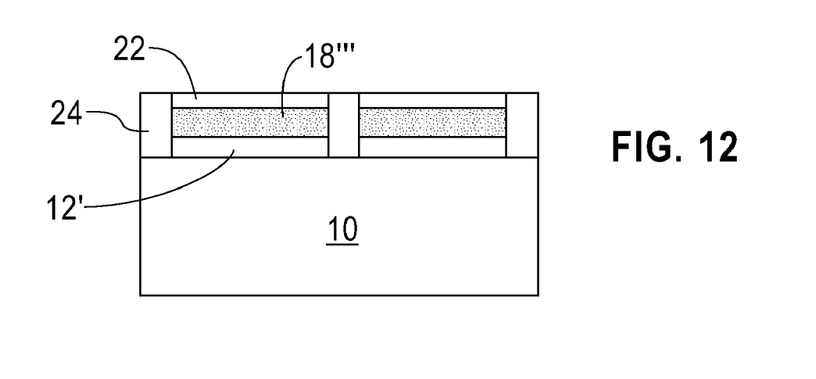
Figure 13:
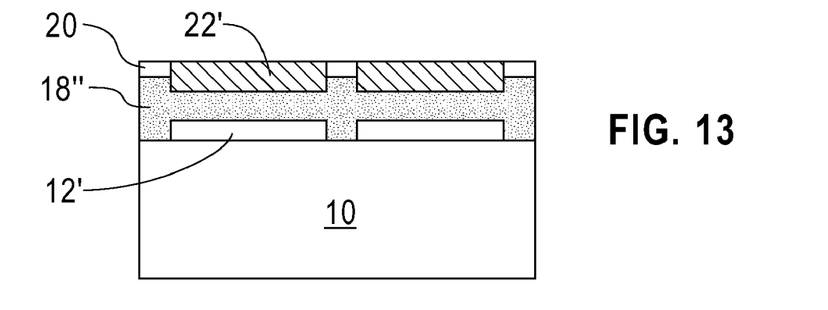
FIG. 13 to FIG. 16 show a series of schematic cross-sectional diagrams illustrating the results of progressive second semiconductor layer deposition (FIG. 13), selective mask stripping (FIG. 14), semiconductor layer patterning (FIG. 15) and isolation region formation (FIG. 16) process steps in fabricating a semiconductor-on-insulator hetero-structure in accordance with another particular more specific embodiment of the invention.
Figure 14:
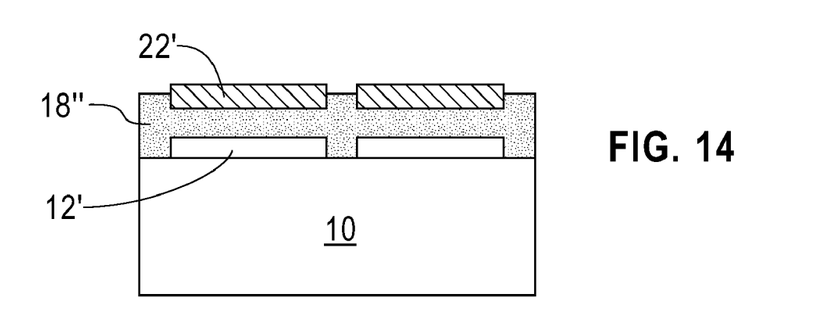
Figure 15:
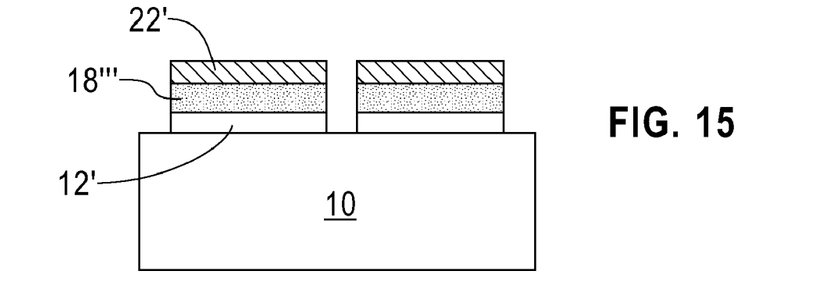

FIG. 12 shows the results of backfilling the plurality of apertures A that is illustrated in FIG. 11 with a plurality of isolation regions 24. The isolation regions 24 may comprise any of several dielectric isolation materials that are generally selected from the same group of dielectric isolation materials as the first dielectric layer 12 and the second dielectric layer 14 that are illustrated in FIG. 1. Typically, the isolation regions 24 are formed using a blanket layer deposition and planarizing process that in turn uses the second semiconductor layers 22 as planarizing stop layers. Suitable planarizing methods may include, but are not necessarily limited to, mechanical planarizing methods and chemical mechanical polish planarizing methods. Chemical mechanical polish planarizing methods are generally more common, but by no means limit the invention.

FIG. 12 shows a schematic cross-sectional diagram of a semiconductor-on-insulator hetero-structure in accordance with a first more specific embodiment of the invention. The semiconductor-on-insulator hetero-structure derives from the semiconductor-on-insulator hetero -structure of FIG. 8 and includes a patterning of the semiconductor material layer 18" to provide semiconductor material layers 18''', as well as a locating and forming a plurality of second semiconductor layers 22 upon the semiconductor material layers 18'''. The semiconductor-on -insulator hetero-structure of FIG. 12 is desirable under circumstances where it is desired to her fabricate germanium metal oxide semiconductor field effect transistor devices within the semiconductor material layers 18''' when comprised of a germanium semiconductor material and the second semiconductor material layers 22 when comprised of a silicon semiconductor material.

FIG. 13 to FIG. 16 show a series of schematic cross-sectional diagrams illustrating the results of progressive stages in further fabricating the semiconductor-on-insulator hetero -structure of FIG. 8 in accordance with another more specific embodiment of the invention that comprises a second more specific embodiment of the invention.

FIG. 13 to FIG. 16 correspond generally with FIG. 9 to FIG. 12, but differ in particular within the context of a thickness of a second semiconductor material layer 22' since the embodiment whose schematic cross-sectional diagram is illustrated in FIG. 9 to FIG. 12 does not provide for use of the selective masks 20 as planarizing stop layers when forming the second semiconductor material layers 22 while the embodiment whose schematic cross-sectional diagrams are illustrated in FIG. 13 to FIG. 16 provides and contemplates that the selective masks 20 may be used as planarizing stop layers when forming the second semiconductor material layers 22'.

Otherwise the semiconductor processing for the semiconductor-on-insulator hetero-structure of FIGS. 13 to FIG. 16 follows analogously with the semiconductor processing for the semiconductor-on-insulator hetero-structure of FIG. 9 to FIG. 12.

Figure 16:
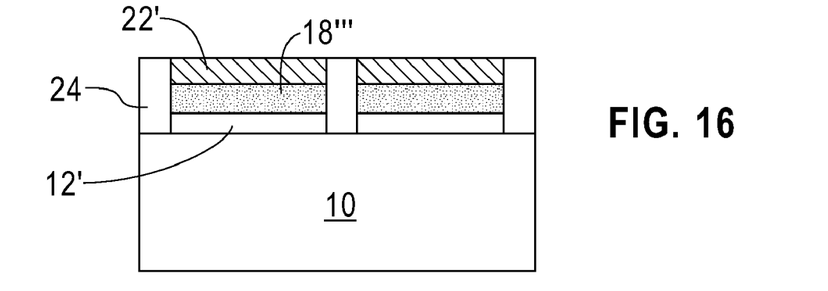

The semiconductor-on-insulator hetero-structure of FIG. 16 may be desirable within the context of complementary metal oxide semiconductor field effect transistor fabrication within compound semiconductor materials.

FIG. 17 to FIG. 20 show a series of schematic cross-sectional diagrams illustrating the results of progressive stages in fabricating a semiconductor-on-insulator hetero-structure in accordance with another particular more specific embodiment of the invention that comprises a third more specific embodiment of the invention.

FIG. 17 to FIG. 20 correspond generally with FIG. 12 to FIG. 16, but include only one second semiconductor material layer 22' along with a correlating thicker semiconductor material layer 18"" to provide opportunity for different types of semiconductor devices within a single semiconductor-on-insulator hetero-structure.

Figure 17:
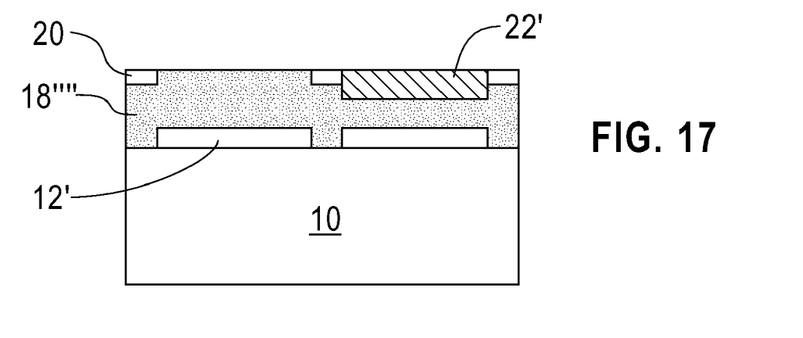
FIG. 17 to FIG. 20 show a series of schematic cross-sectional diagrams illustrating the results of progressive second semiconductor layer deposition (FIG. 17), selective mask stripping (FIG. 18), semiconductor layer patterning (FIG. 19) and isolation region formation (FIG. 20) process steps in fabricating a semiconductor-on-insulator hetero-structure in accordance with another particular more specific embodiment of the invention.
Figure 18:
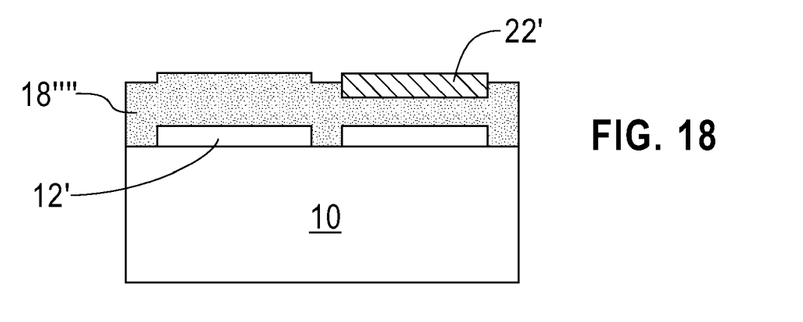
Figure 19:
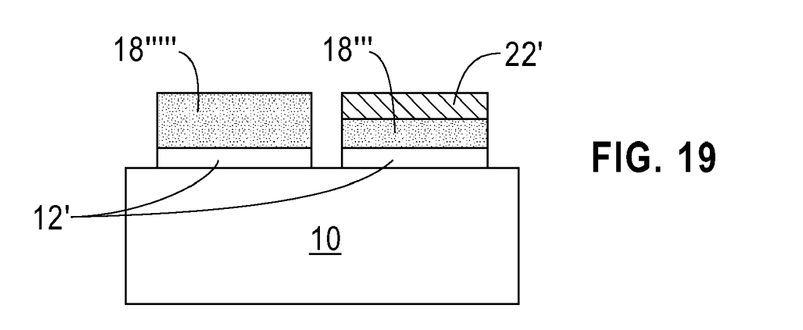
Figure 20:
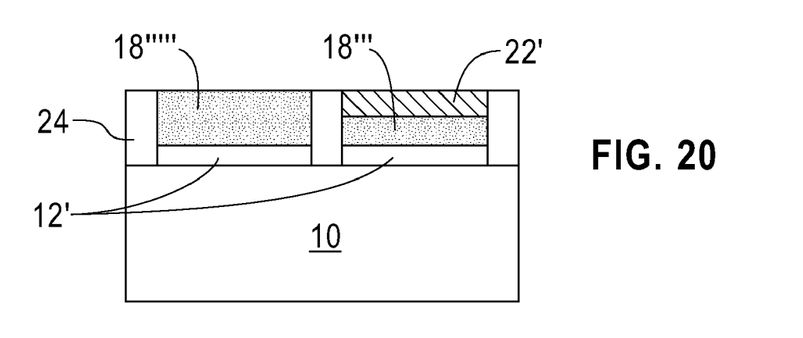

The semiconductor-on-insulator hetero-structure whose schematic cross-sectional diagram is illustrated in FIG. 17 may be fabricated from the semiconductor-on-insulator hetero -structure whose schematic perspective-view diagram is illustrated in FIG. 8 while using separately masked sequential epitaxial methods that provide the semiconductor material layer 18"" and the second semiconductor material layer 22'. Upon patterning of the semiconductor material layer 18"" there is obtained, as illustrated in FIG. 19, a semiconductor material layer 18"" and a first semiconductor material layer 18'''.

Figure 21:
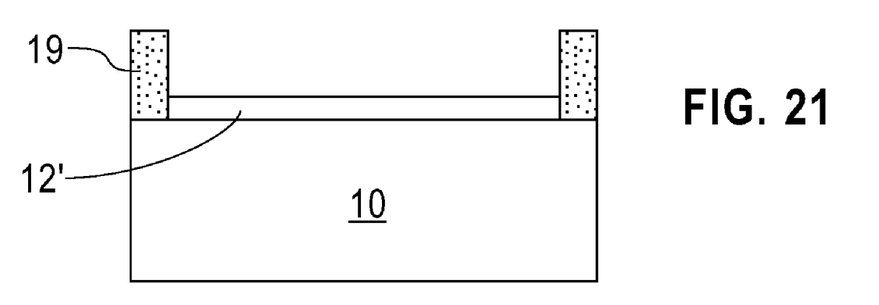
FIG. 21 to FIG. 23 show a series of schematic cross-sectional diagrams illustrating the results of progressive epitaxial aperture fill layer (FIG. 21), selective mask formation (FIG. 22) and strained epitaxial planar layer (FIG. 23) process steps in fabricating a semiconductor-on-insulator hetero-structure in accordance with a second general embodiment of the invention.
Figure 22:
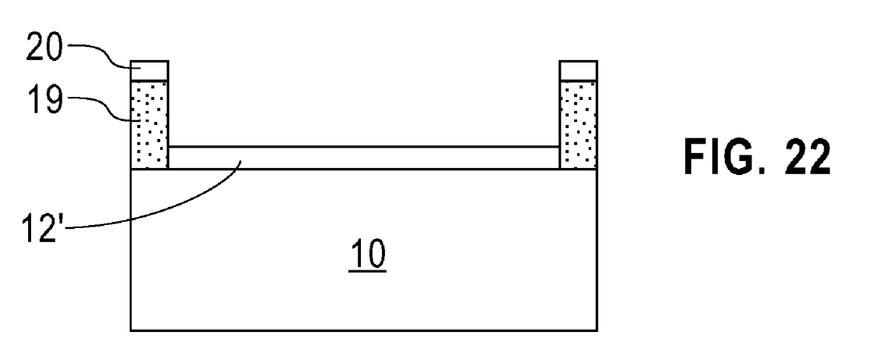
Figure 23:
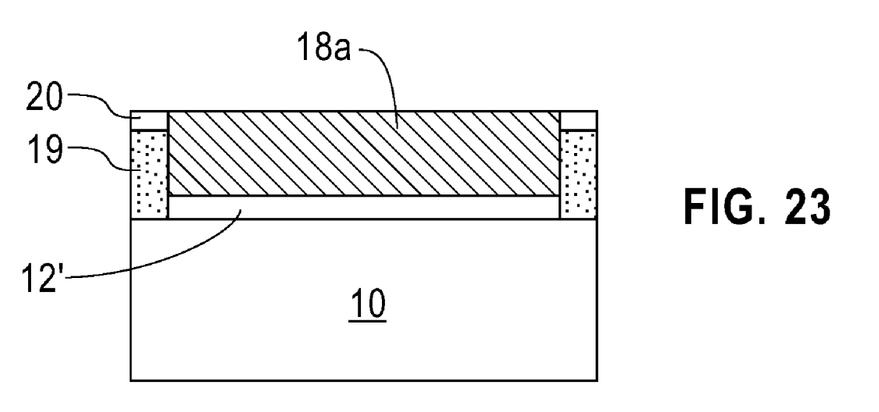

FIG. 21 to FIG. 23 show a series of schematic cross-sectional diagrams illustrating an alternate (i.e., second) general embodiment of the invention that may be used in place of the first general embodiment of the invention that is illustrated within the schematic perspective-view diagrams of FIG. 1 to FIG. 8.

FIG. 21 to FIG. 23 illustrate, in place of a single semiconductor material layer 18/18'/18" that both fills an aperture within a dielectric layer 12' located over a crystalline substrate 10 and spans conformal and planar upon the dielectric layer 12': (1) an aperture filling crystalline layer 19 that is aligned over and fills the aperture, and contacts the crystalline substrate 10 but does not span over the dielectric layer; and (2) a separate semiconductor material layer 18a located and formed aligned upon the first dielectric layer 12' but not spanning or aligned over the aperture.

The semiconductor-on-insulator hetero-structure whose schematic cross-sectional diagrams are illustrated in FIG. 21 to FIG. 23 is desirable insofar as by using separate materials for the aperture filling crystalline layer 19 (i.e., such as but not limited to a silicon -germanium alloy when the crystalline substrate 10 comprises a silicon semiconductor substrate) and the semiconductor material layer 18a (i.e., such as but not limited to a germanium material when the aperture filling crystalline layer 19 comprises the silicon-germanium alloy) a strain may be introduced into the semiconductor material layer 18a while still being formed with reduced defects, due to the absence of sidewall defects within the aperture filling crystalline layer 19.

The preferred embodiments of the invention, both general embodiments and more specific embodiments, are illustrative of the invention rather than limiting of the invention. Revisions and modifications may be made to methods, materials, structure and dimensions of a semiconductor-on-insulator hetero-structure in accordance with the preferred embodiments, while still providing a semiconductor-on-insulator hetero-structure and a method for fabrication thereof in accordance with the invention, further in accordance with the accompanying claims.

What is claimed is:

1. A method for fabricating a semiconductor structure comprising:

forming upon a crystalline substrate a dielectric layer that includes an aperture that leaves exposed a portion of the crystalline substrate, wherein the crystalline substrate is a crystalline silicon semiconductor substrate;

forming a semiconductor layer of composition different than the crystalline substrate within and over the aperture and upon the dielectric layer, the semiconductor layer comprises a germanium containing semiconductor material, wherein:

a portion of the semiconductor layer located aligned within and over the aperture has a defect density greater than 10e7 defects per square centimeter ; and a portion of the semiconductor layer located aligned over the dielectric layer has a defect density less than 10e6 defects per square centimeter.

2. The method of claim 1 further comprising forming a second semiconductor layer of composition different than the semiconductor layer upon the semiconductor layer.

3. The method of claim 1 further comprising a second semiconductor layer of composition different than the semiconductor layer upon only a portion of the semiconductor layer to leave exposed portions of the semiconductor layer and second semiconductor layer.

4. The method of claim 3 wherein
the second semiconductor layer comprises a compound semiconductor material.

5. The method of claim 1 wherein the forming the semiconductor layer includes:

a masked vertical epitaxial deposition method for forming the portion aligned within and over the aperture that includes the defect; and a masked selective horizontal epitaxial deposition method for the portion aligned over the dielectric layer that does not include the defect.

6. A method for fabricating a semiconductor structure comprising:

forming upon a crystalline substrate a dielectric layer having an aperture that leaves exposed a portion of the crystalline substrate, wherein the crystalline substrate is a crystalline silicon semiconductor substrate;

forming a crystalline material layer of composition different than the crystalline substrate located within, extending over and aligned over the aperture and having a defect density greater than 10e7 defects per square centimeter within the crystalline material layer, the crystalline material layer comprises a silicon-germanium alloy semiconductor; and forming a strained semiconductor layer of composition different than the crystalline material layer abutting the crystalline material layer and aligned over the dielectric layer and having a defect density less than 10e6 defects per square centimeter within the semiconductor layer.

7. The method of claim 6 wherein
the strained semiconductor layer comprises a germanium semiconductor material.

8. The method of claim 6 wherein the forming the crystalline material layer uses a masked vertical epitaxial deposition method.

9. The method of claim 6 wherein the forming the strained semiconductor layer uses a masked selective horizontal epitaxial deposition method.

* * * * *